United States Patent
Noguchi et al.

(10) Patent No.: US 6,917,072 B2
(45) Date of Patent: Jul. 12, 2005

(54) SEMICONDUCTOR MEMORY DEVICE

(75) Inventors: Mitsuhiro Noguchi, Yokohama (JP); Akira Goda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/393,946

(22) Filed: Mar. 24, 2003

(65) Prior Publication Data

US 2004/0094793 A1 May 20, 2004

(30) Foreign Application Priority Data

Nov. 15, 2002 (JP) ......................................... 2002-331974

(51) Int. Cl.⁷ ............................................. H01L 29/792
(52) U.S. Cl. ........................ 257/324; 257/314; 257/315; 438/201; 438/211; 438/257
(58) Field of Search ................................. 257/314–315, 257/324; 438/201, 211, 257

(56) References Cited

U.S. PATENT DOCUMENTS 6,661,040 B2 * 12/2003 Takashino .................... 257/202
2004/0094793 A1    5/2004 Noguchi

FOREIGN PATENT DOCUMENTS

JP          9-74146        3/1997
JP          10-284627      10/1998

OTHER PUBLICATIONS

U.S. Appl. No. 10/393,946, filed Mar. 24, 2003, Noguchi et al.
U.S. Appl. No. 10/954,238, filed Oct. 1, 2004, Goda et al.
U.S. Appl. No. 10/393,946, filed Mar. 24, 2003, Noguchi et al.
U.S. Appl. No. 10/822,177, filed Apr. 12, 2004, Noguchi et al.
U.S. Appl. No. 10/393,946, filed Mar. 24, 2003 Noguchi et al.
U.S. Appl. No. 10/850,408, filed May 21, 2004, Noguchi et al.
F. Masuoka, "Handbook of Flash Memory Technologies", 1993, pp. 206–215.

* cited by examiner

Primary Examiner—Donghee Kang
(74) Attorney, Agent, or Firm—Oblon, Spivak, McClelland, Maier & Neustadt, P.C.

(57) ABSTRACT

A semiconductor memory device comprises a first conductivity type semiconductor region, a second conductivity type source and drain regions provided in the semiconductor region, a gate insulating film structure provided on the semiconductor region between the source region and drain region and including a first insulating film, a charge accumulation layer and a second insulating film, the charge accumulation layer being selected from a silicon nitride film, a silicon oxynitride film, an alumina film and a stacked film of these films, a control gate electrode provided on the second insulating film, a gate sidewall provided on a side of the control gate electrode and having a thickness thinner than that of the second insulating film in the center of the control gate electrode, a third insulating film provided above the control gate electrode, and a fourth insulating film provided to cover the gate electrode sidewall and the third insulating film.

21 Claims, 9 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2002-331974, filed Nov. 15, 2002, the entire contents of which are incorporated herein by reference.

BACKGROUND OF THE INVENTION

1. Field of the Invention

The present invention relates to a semiconductor memory device, particularly relates to a structure of a MONOS memory cell, e.g., it is applicable to a NAND type and a NOR type of flash memory.

2. Description of the Related Art

EEPROM has been developed which is provided with an array of electrically programmable and erasable memory cells and which is one of non-volatile semiconductor memory devices. The EEPROM is one in which information of digital bits are read by measuring a change in conductance of a transistor according to the amount of charge injected into a charge accumulation layer by a tunneling current from a channel of a cell transistor through an insulating film. In the EEPROM, there are a MONOS memory, a MNOS memory, and a memory having a floating gate structure.

The MONOS memory uses a cell transistor having a structure of metal/oxide film/nitride film/oxide film/semiconductor region. When a SiN film is used as the charge accumulation layer of the cell transistor, low-voltage programming or low-voltage erasing operation can be performed, compared with a memory using a polysilicon floating gate. One example of a structure of the cell transistor and a manufacturing process of such MONOS memory is disclosed in Japanese Patent Laid-Open 284627/1998.

FIGS. 10A and 10B show one example of a gate sectional structure which includes the cell transistor of a memory cell region and a MISFET of a peripheral circuit region in the manufacturing process of the conventional MONOS memory.

In FIGS. 10A and 10B, a stacked gate of the cell transistor has the structure in which a first silicon oxide film 24, a silicon nitride film (charge accumulation layer) 25, a second silicon oxide film 26, and a gate electrode 28 of polysilicon are stacked in order on a semiconductor substrate 21. The first silicon oxide film 24 has a function of intentionally passing through the charges, and the second silicon oxide film 26 has the function of blocking current between the silicon nitride film 25 and the gate electrode 28.

On the other hand, in the MISFET, the gate electrode 28 is formed on the semiconductor substrate 21 through a gate insulating film 22. A gate sidewall film 23 of PSG is formed as gate sidewall spacers of these cell transistors and the MISFET.

In the semiconductor substrate 21, a source region and a drain region (hereinafter referred to as source/drain region) 29 of the cell transistor are provided, and the source/drain region 29' of the MISFET is provided.

One example of a method forming the cell transistor is described in the above-described patent document.

That is, as shown in FIG. 10A, when the gate electrode 28 of the cell transistor is etched, the polysilicon film is etched down to the first silicon oxide film 24 so that the gate electrode 28 is formed in a desired shape.

Then, for example, phosphorus is ion-implanted with a dose of $1.5 \times 10^{13}$ cm$^{-2}$, as shown in FIG. 10B, thereby providing an n-type region having a low concentration, which becomes part of the source/drain region 29.

Thereafter, the insulating film of PSG is deposited, and the gate sidewall film 23 is left in the gate sidewall. Further, phosphorus is ion-implanted with a condition of $5 \times 10^{15}$ cm$^{-2}$ to provide the n-type region having a high concentration which becomes part of the source/drain region 29.

The n-type region of the low concentration is formed in the source/drain region 29 in order to prevent drain breakdown voltage at a gate edge from decreasing.

When the MISFET of the peripheral circuit is formed on the same substrate as the cell transistor by using the same gate electrode material, in the related art, gate electrode processes are performed simultaneously for reducing the process. This results in a problem of reliability of the MISFET. The problem will be described bellow.

As shown in FIG. 10A, when the polysilicon film of the gate electrode 28 in the MISFET is etched through the gate insulating film (thermal oxidation film) 22 formed on the semiconductor substrate 21, a selection ratio of the etching of the gate electrode 28 to the gate insulating film 22 is not infinite. Therefore, a film thickness of the gate insulating film 22 is decreased in etching the gate electrode 28, undercut will be slightly generated under the gate electrode 28.

Then, as shown in FIG. 10B, after the n-type region of the low concentration is formed, which becomes part of the source/drain region 29', the PSG film is deposited and etched to form the gate sidewall film 23 of the cell transistor. In this case, the gate sidewall film 23 is also formed in a gate edge portion of the MISFET.

Generally, the deposited silicon oxide film including the PSG film deposited on the gate sidewall film 23 has less breakdown voltage characteristics, compared with the gate insulating film 22 formed by the thermal oxidation of the silicon substrate, so that the breakdown voltage of the gate insulating film between the source/drain region 29' and the gate electrode 28 is degraded and a leakage current is increased.

Further, the above-described patent document describes that after the n-type region of the high concentration which becomes part of the source/drain regions 29 and 29' is produced, an interlayer insulating film made of BPSG or PSG is deposited and the silicon nitride film is formed on the memory cell by a plasma chemical vapor deposition method.

However, a large amount of hydrogen, which is generated in forming the silicon nitride film or contained in the silicon nitride film, is easily diffused into silicate glass such as PSG and BPSG during, e.g., an after-thermal process such as a sintering process. As a result, the hydrogen changes trap density of SiN, which becomes the charge accumulation layer 25, and surface state density of the tunneling insulating film, and charge retaining characteristics of the cell transistor are fluctuated by depositing conditions of SiN or presence or absence of the deposition, which causes the reliability to be decreased.

Also, the above-described patent document describes that BPSG or PSG is used as the interlayer insulating film and heat treatment for viscous flow is performed under conditions of 900° C. for 30 minutes.

However, in the heat treatment, moisture or hydronium ion which is contained in BPSG or PSG is diffused to oxidize the gate edge, so that a shape of the gate edge is changed.

Similarly to the above-described explanation, when inorganic glass made of, e.g., cyclopentasilane or polysilazane is used as the interlayer insulating film, an oxidation process is required for transformation into the inorganic glass, the gate edge is oxidized by the thermal process and the shape of the gate edge is changed.

As described above, in the structure of the cell transistor of the MONOS memory, when the MISFET is formed on the same substrate by using the same gate electrode material, the reliability of the gate insulating film in the MISFET is decreased, and further when the oxidation process is introduced for transformation into the inorganic glass which becomes the interlayer film, the moisture in the silicate glass which becomes the interlayer insulating film oxidizes the gate edge, and the shape of the gate edge portion is changed to decrease the reliability.

Further, it has been uncertain what sidewall shape of the gate electrode in the cell transistor of the MONOS memory can suppress worsening of the characteristics, which is caused by short channel effect in a gate length, e.g., not more than 0.2 μm, of the cell transistor, and/or improve erasing speed.

BRIEF SUMMARY OF THE INVENTION

According to an aspect of the present invention, there is provided a semiconductor memory device comprising: a semiconductor region having a first conductivity type; source and drain regions of an electrically programmable and erasable memory cell transistor, provided in the semiconductor region, having a second conductivity type; a gate insulating film structure provided on the semiconductor region between the source and drain regions, the gate insulating film structure being comprised of a first insulating film, a charge accumulation layer and a second insulating film, the charge accumulation layer being composed of one material selected from a silicon nitride film, a silicon oxynitride film, an alumina film and a stacked film of these films; a control gate electrode provided on the second insulating film; a gate sidewall provided on a side of the control gate electrode, the thickness thereof being thinner than that of the second insulating film in the central area of the control gate electrode; a third insulating film provided above the control gate electrode; and a fourth insulating film provided to cover the gate electrode sidewall and the third insulating film therewith.

DETAILED DESCRIPTION OF THE INVENTION

Figure 1:
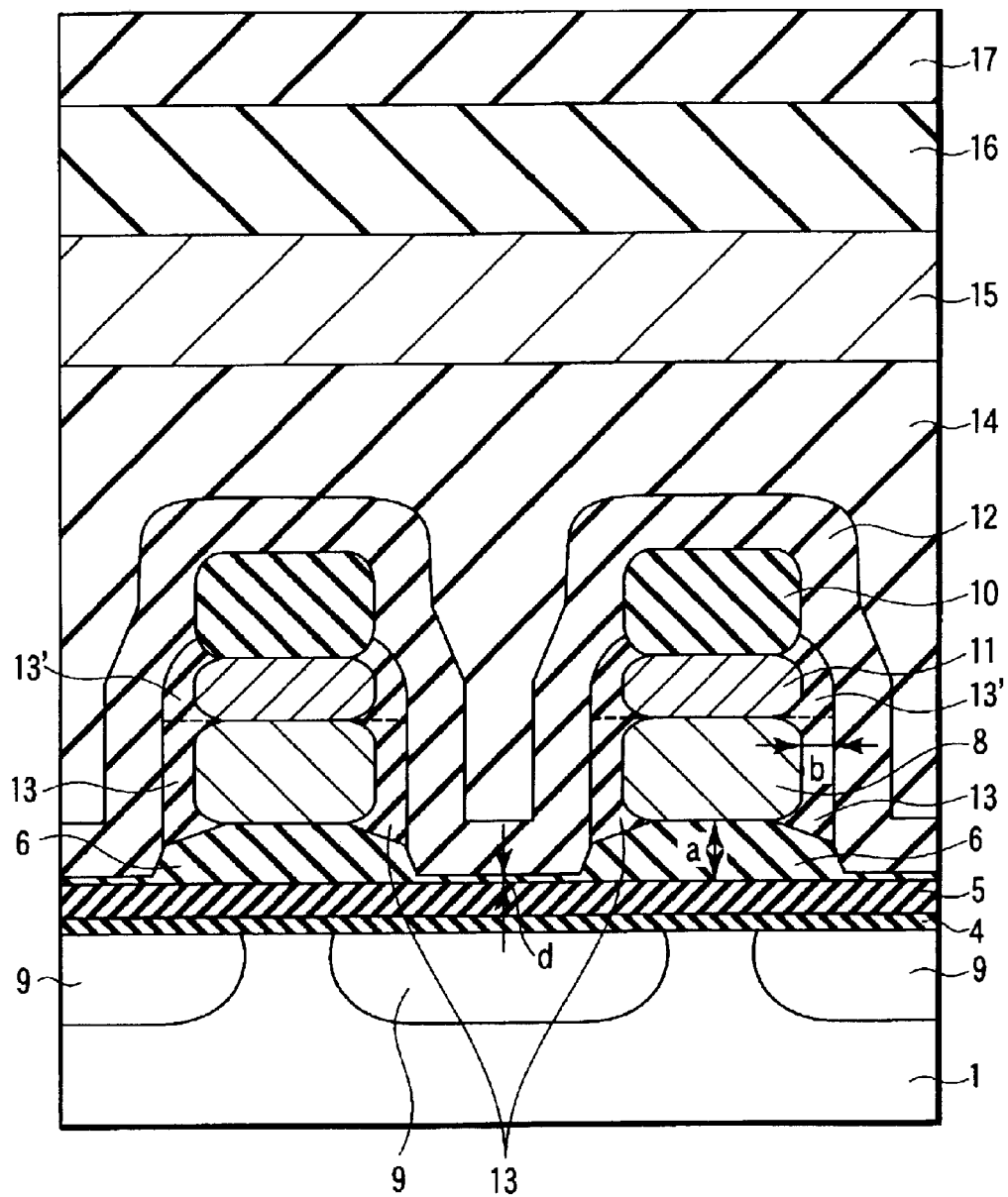
FIG. 1 is a sectional view showing a gate structure of a MONOS memory cell transistor utilized in a NAND type EEPROM according to a first embodiment.

Referring to the drawings, preferred embodiments of the invention will be described in detail bellow.

(First Embodiment)

FIG. 1 shows a structure of two adjacent cell transistors in the memory cell array of the MONOS memory.

In the cell transistor, compared with conventional the cell transistor, it is characterized in that a thickness "b" of a sidewall 13 formed by oxidation or oxynitriding of the gate sidewall is smaller than a thickness "a" of a central portion in a gate insulating film 6.

In FIG. 1, a first insulating film (tunneling oxide film) 4 is formed on a p-type semiconductor region (substrate) 1, and a charge accumulation layer 5, a second insulating layer (top oxide film, blocking oxide film) 6, and a gate electrode (control gate electrode) 8 are formed in order on the first insulating film 4. A metal backing layer 11 is formed on an upper surface of the gate electrode 8, and a third insulating film 10 is formed on the metal backing layer 11. The thickness of the second insulating film 6 is "a" at a position under a central portion of the gate electrode 8. Hereinafter, the gate insulating film having a stacked structure of the first insulating film 4, the charge accumulation layer 5, and the second insulating film 6 is called a stacked ONO film.

In a semiconductor region 1, an n-type region which forms a source region or a drain region (hereinafter referred to as source/drain region 9) is formed, while a channel region located below the gate electrode 8 is provided between the source/drain regions 9.

The cell transistor of the MONOS type of EEPROM memory, in which the amount of information is the amount of charge accumulated in the charge accumulation layer 5, is formed by the source/drain regions 9, the stacked ONO film, and the gate electrode 8, and the gate length of the cell transistor is in the range from 0.01 μm to 0.2 μm.

Gate sidewalls 13 (hereinafter referred to as sidewall) are formed on both sides of the gate electrode 8. The thickness of the sidewall 13 is "b". At least the sidewall 13 in contact with the gate electrode 8 is made of a silicon oxide film or a silicon oxynitride film which is formed by the oxidation or the oxynitriding of the gate electrode 8 including silicon. FIG. 1 shows a state in which part of the sidewall 13 slightly intrudes between the gate electrode 8 and the second insulating film 6.

As described above, in the case where the metal backing layer 11 is formed on the gate electrode 8 before the processing of the gate, since the metal backing layer 11 is also oxidized or oxynitrided when the sidewall 13 is formed, a sidewall 13' is simultaneously formed.

A fourth insulating film 12, a first interlayer insulating film 14, an upper wiring layer 15, a second interlayer insulating film 16, and a passivation film 17 are formed in order on the sidewalls 13 and 13'.

In the above-described structure, the semiconductor region 1 is the p-type silicon region having an impurity concentration of, e.g., boron or indium in the range from $10^{14}$ cm$^{-3}$ to $10^{19}$ cm$^{-3}$. The first insulating film 4 is made of, e.g., the silicon oxide film or an oxynitride film which has the thickness of the range from 0.5 nm to 10 nm. The charge accumulation layer 5 is made of, e.g., a silicon nitride film having the thickness of from 3 nm to 30 nm.

The second insulating film 6 is made of the silicon oxide film which has the thickness of the range from, e.g., 5 nm to 30 nm or the silicon oxynitride film whose oxygen composition is larger than that of the charge accumulation layer 5, an $Al_2O_3$ film, a ZrSiO film, an HfSiO film, an HfSiON film, a ZrSiON film, or the stacked film of those films.

In the gate electrode 8, for example, boron, phosphorus, or arsenic is added as an impurity to a polysilicon layer having the thickness of, e.g., from 10 nm to 500 nm with concentration range from $1 \times 10^{19}$ cm$^{-3}$ to $1 \times 10^{21}$ cm$^{-3}$. When the control gate electrode 8 is depleted, an electric field applied to the stacked ONO film is decreased, which results in an increase in erasing time or writing time. It is desirable that the concentration of boron, phosphorus, or arsenic is more than $1 \times 10^{19}$ cm$^{-3}$ in order to prevent erasing time or programming time from increasing.

The metal backing layer 11 is formed on the polysilicon layer for forming gate electrode and made of WSi, NiSi, MoSi, TiSi, CoSi, W, Al, AlCu, or the like. Those materials have the thickness of, e.g., from 10 nm to 500 nm and are formed for decreasing resistance of the gate electrode 8.

The third insulating film 10 functions as a mask in forming the gate electrode at a post-process and is made of the silicon nitride film or the silicon oxide film which has the thickness of, e.g., from 5 nm to 500 nm.

The source/drain regions 9 are produced by diffusing or implanting the n-type impurity such as phosphorus, arsenic, or antimony into the region 1 in the depth between 10 nm and 500 nm so as to have the surface concentration from $10^{17}$ cm$^{-3}$ to $10^{21}$ cm$^{-3}$.

Particularly in the cell transistor of the MONOS memory, in order to prevent formation of defect and degradation of drain breakdown voltage in forming the source/drain regions 9, low amount of ion implantation is desirable such that damaged regions caused by the implanted ions are not connected. Concretely, the doping amount of phosphorus, arsenic, or antimony in the source/drain regions 9 is retained not more than $5 \times 10^{18}$ cm$^{-3}$ under the gate electrode 8. Since it may be considered that an activation rate is almost 1 in such low amount of the doping, a second conductivity type of carrier concentration is retained not more than $5 \times 10^{18}$ cm$^{-3}$.

In order to suppress a difference between a programming threshold value and a short channel effect of a erasing threshold value of the cell transistor for the reason described later, the source/drain regions 9 are formed to further extend to a central direction of the channel, compared with the length that the sidewall 13 described later has intruded between the gate electrode 8 and the second insulating film 6.

The fourth insulating film 12 is the deposited insulating film formed by, e.g., a CVD (Chemical Vapor Deposition) method or a sputtering method. The fourth insulating film 12 is made of, e.g., the silicon nitride film, the silicon oxynitride film, or an alumina film, and formed in the thickness range, e.g., from 5 nm to 200 nm. As described later, in order that a gas, radical or ion from the film formed above the fourth insulating film 12 is prevented from adversely influencing the memory cell, the fourth insulating film 12 is deposited over the third insulating film 10 on the gate electrode of the cell transistor and formed so as to cover the side face of the gate electrode and the source/drain regions 9 at least between the two adjacent cell transistors.

The first interlayer insulating film 14 is made of, e.g., silicate glass such as BPSG, PSG, or BSG which contains boron or phosphorus of not less than $1 \times 10^{20}$ cm$^{-3}$, and is formed in the thickness range, e.g., from 10 nm to 1000 nm. The silicate glass has the function of gettering alkali ion, and is formed over the cell transistor in order to prevent contamination caused by the alkali ion.

The upper wiring layer 15 is made of, e.g., W, Al, AlCu, or Cu. In the embodiment, however, only one layer is shown as the wiring layer, the multilayer wiring structure may be built up.

The second interlayer insulating film 16 is made of, e.g., the silicon oxide film, which is formed by TEOS or HDP (High Density Plasma) or HSQ. In the passivation film 17, for example, the silicon nitride film deposited by a plasma chemical vapor deposition method is deposited over the surface with the thickness range, e.g., from 20 nm to 1 µm.

As described above, in the structure of the cell transistor of the first embodiment, a thermal oxide film which has high quality compared with the deposited insulating film of the related art is used as the gate sidewall 13, so that charge trap density is decreased in the gate sidewall and a fluctuation in the threshold value can be prevented.

Further, in order to decrease the charge trap density of the sidewall 13 lower than that of the charge accumulation layer 5, it is desirable that the oxygen composition of the sidewall 13 is increased more than that of the charge accumulation layer 5.

Electrons injected into the sidewall 13 are not reduced by injecting holes from the semiconductor region 1 because the injected electrons are spaced apart from the semiconductor region 1, so that the electrons are cumulatively accumulated. Therefore, by increasing the oxygen composition of the sidewall 13 more than that of the charge accumulation layer 5, the problem that the fluctuation in the threshold value, which is difficult to control, occurs can be avoided. In this case, the fluctuation in the threshold value is caused by leakage of the charge to be accumulated in the charge accumulation layer 5 and by cumulative accumulation in the sidewall 13.

Since the dielectric breakdown voltage of the sidewall 13 is improved, interface level density between the gate electrode 8 and the sidewall 13 can be lowered, so that the voltage higher than the related art can be applied between the gate electrode 8 and the source/drain regions 9.

In FIG. 1, as described above, a boundary between the sidewalls 13 and 13', which is simultaneously formed by oxidizing or oxynitriding the metal backing layer 11, is shown by a broken line. However, since a component metal element of the metal backing layer 11 is added to the sidewall 13', insulating characteristics such as breakdown voltage per unit thickness are degraded as compared with those of the sidewall 13.

However, since the charge is intentionally injected into the charge accumulation layer 5 during data programming in the cell transistor having the structure of FIG. 1, the high electric field is applied between the main gate electrode 8 and the semiconductor region 1 or the drain region 9, and the low electric field is applied between the gate regions 8 adjacent to each other. The low electric field is applied between the gate regions 8 adjacent to each other during data erasing. Consequently, as described above, at least the side surface adjacent to the gate electrode 8 in the sidewall 13 may be formed so that it is composed of the high quality insulating film made of, e.g., the silicon oxide film or the silicon oxynitride film.

Whether the sidewall 13 is formed by the oxidation or oxynitriding process or formed by the deposited film like the related art can be distinguished as follows.

As described above, when the metal backing layer 11 is formed on the gate electrode 8 before gate processing, the sidewall 13 made of the silicon oxide film or the silicon oxynitride film and the sidewall 13' made of the oxide or nitride of the metal backing layer 11 are simultaneously formed. Accordingly, in the case that the sidewall 13' is formed, it is possible to determine that the sidewall 13 is formed by the oxidation or oxynitriding process.

Also, as described above, when the third insulating film 10 for the processing mask of the gate electrode is made of the silicon nitride film, since the silicon in the gate electrode 8 is transformed into the silicon oxide film or silicon oxynitride film in forming the sidewall 13, the gate electrode 8 is formed so as to be decreased in the gate length direction by the amount of formation of the oxide film smaller than the third insulating film 10. Accordingly, in the case that the film thickness is decreased, it is possible to determine that the sidewall 13 is formed by the oxidation or oxynitriding process.

Figure 2:
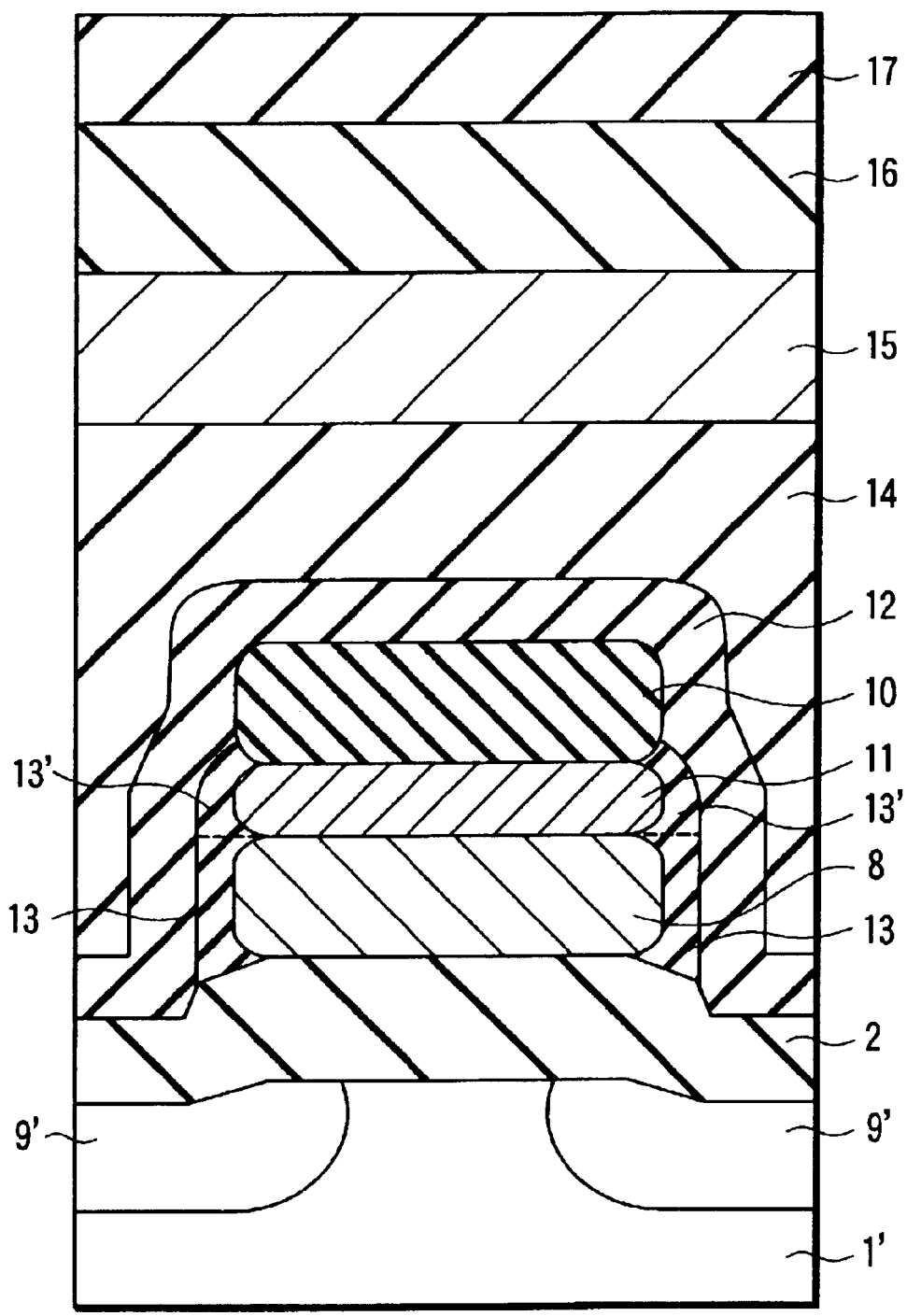
FIG. 2 is a sectional view showing the gate structure of a MISFET for a peripheral circuit, which is formed on the same semiconductor substrate as the cell transistor shown in FIG. 1 and in which gate electrodes of the MISFET and the cell transistor are processed in common.

FIG. 2 shows a sectional structure of a MISFET for a peripheral circuit, which is formed on the same semiconductor substrate as the cell transistor shown in FIG. 1 and in which the gate electrode 8 of the MISFET for the peripheral circuit is processed in common with that of the cell transistor.

In FIG. 2, a semiconductor region 1' may be the region formed by the same body as the semiconductor region (p-type silicon layer) shown in FIG. 1, for example, the region may be a p-type well formed in an n-type well in a p-type silicon substrate or the region may be the p-type well formed directly on the p-type silicon substrate. The gate insulating film 2 formed on the semiconductor region 1' is made of the silicon oxide film or the silicon oxynitride film which has the thickness of, e.g., from 5 nm to 50 nm.

Similarly to the gate electrode (control gate electrode) 8 shown in FIG. 1, the gate electrode 8 formed on the gate insulating film 2 is composed of the polysilicon layer, to which for example, boron, phosphorus, or arsenic is added as the impurity, having the thickness of from 10 nm to 500 nm with the concentration range from $1 \times 10^{19}$ cm$^{-3}$ to $1 \times 10^{21}$ cm$^{-3}$. The gate electrode 8 and the gate electrode 8 in FIG. 1 are processed by the same lithography technique to reduce the process.

In the semiconductor region 1', the n-type regions are formed as source/drain regions 9' while the channel region is provided below the gate electrode 8. Similarly to the source/drain region 9 of the cell transistor in FIG. 1, the source/drain region 9' is formed in the thickness range between 10 nm and 500 nm by diffusing or ion-implanting for example, phosphorus, arsenic, or antimony into region 1' so that the surface concentration is in the range from $1 \times 10^{17}$ cm$^{-3}$ to $1 \times 10^{21}$ cm$^{-3}$.

The n-type MISFET is provided by the source/drain regions 9', the gate insulating film 2, and the gate electrode 8. In the embodiment, the gate length of the MISFET is in the range from 0.01 $\mu$m to 1.0 $\mu$m.

In FIG. 2, the third insulating film 10, the metal backing layer 11, the fourth insulating film 12, the sidewalls 13 and 13', the first interlayer insulating film 14, the upper wiring layer 15, the second interlayer insulating film 16, and the passivation film 17 are the same as those shown in FIG. 1.

Manufacturing process of the structure shown in FIGS. 1 and 2 may be the same after the gate insulating film 2 of the MISFET is formed in FIG. 2 and the insulating films 4, 5, and 6 of the cell transistor are formed in FIG. 1. For example, a method described in Japanese Patent Application No. 2001-264754, which is a prior application by the inventors, may be used, so that the description will be omitted.

According to the MISFET shown in FIG. 2, similarly to the cell transistor shown in FIG. 1, the sidewall 13 is formed by the oxidation or oxynitriding of the gate electrode 8 containing silicon, so that the film thickness can be increased at the gate sidewall portion, thereby to prevent the electric field concentration at the gate edge. Consequently, reliability can be improved more than the related art.

Further, the semiconductor region 1' is simultaneously oxidized or oxynitrided in forming the sidewall 13. Accordingly, compared with the cell transistor shown in FIG. 1, a distance between the gate electrode 8 and the source/drain regions 9' can be widened, and the electric field concentration can be decreased at the gate edge to reduce the leakage current from the gate electrode 8.

The electric insulation between the gate electrode 8 and the source/drain regions 9, and between the gate electrode 8 and a contact or the upper wiring layer is retained by the sidewall 13 and the gate insulating film 2.

Since the n-type ion implantation is carried out through the sidewall 13 in order to form the source/drain regions 9', the edge of the gate electrode 8 is spaced apart the thickness of the sidewall 13 from a defect region caused by the ion-implantation to reduce the damage caused by the ion-implantation for the gate insulating film 2 between the gate electrode 8 and the semiconductor region 1'.

Since the silicon nitride film or the silicon oxynitride film, whose nitrogen composition is higher than that of the sidewall 13, is used as the fourth insulating film 12 in FIGS. 1 and 2, unwanted penetration of a hydronium ion or oxygen from films formed above the fourth insulating film 12 can be prevented, and a change in a shape caused by the oxidation of the gate edge in the memory cell with the hydronium ion or the oxygen can be prevented.

In the formation of the fourth insulating film 12, a deposited SiN film is produced at a temperature range from 600° C. to 1000° C., using e.g., DCS (dichlorosilane), TCS (tetrachlorosilane), or HCD (hexachlorodisilane). The SiN film formed by the above-described way is denser than the silicon nitride film deposited with the plasma chemical vapor deposition method at a temperature not more than 500° C., thereby preventing the transmission of the hydronium ion, the oxygen, or hydrogen.

As shown in FIG. 1, when the gate electrode 8 is higher than the sidewall 13', a distance from the fourth insulating film 12 to the blocking oxide film 6 of the gate edge through the sidewall 13 is shorter than the distance from the fourth insulating film 12 to the blocking oxide film 6 of the gate edge through the sidewall 13'. This allows the contamination to the blocking oxide film 6 of the gate edge through the sidewall 13, which is caused by a metal ion from the fourth insulating film 12, to occur more easily than the contamination caused by the metal ion from the sidewall 13'. In order to suppress the contamination caused by the metal ion from the fourth insulating film 12, density of a metallic atom in the fourth insulating film 12 is formed smaller than the density of the metallic atom in the sidewall 13'.

By using the silicon nitride film, the silicon oxynitride film or the alumina film as the fourth insulating film 12, the penetration of the hydrogen can be prevented. Accordingly, since the hydrogen from films formed above the fourth insulating film 12 changes the trap density of the charge accumulation layer 5 or the surface state density of the tunneling insulating film, the charge retaining characteristics of the memory cell can be prevented.

By decreasing a distance "d" between the fourth insulating film 12 and the charge accumulation layer 5 smaller than the thickness "a" of the blocking oxide film 6 at the central portion under the gate electrode 8, it is difficult that the hydronium ion, the oxygen ion, the hydrogen ion, or the alkali ion such as Na intrudes from a processing edge of the fourth insulating film 12 through the silicon oxide film between the fourth insulating film 12 and the charge accumulating layer 5. It is clear from a technique known by those skilled in the art that the silicon nitride film is denser than the silicon oxide film and blocks well the hydronium ion, the oxygen, the hydrogen, or the alkali ion.

As is well known, when the alkali ion contaminates the blocking oxide film 6 of the cell transistor, the alkali ion becomes a charged trap which can move at a high temperature and a high electric field, which causes the threshold value of the cell transistor to be changed even if the charge injection conditions are the same. This results in the damaged reliability. Also, since the leakage current of the blocking oxide film 6 is increased, it is causal that the electron is injected from the gate electrode 8 to the charge accumulation layer 5 during erasing, which causes a problem such that the cell transistor is not deeply erased. However, the problem can be avoided according to the structure of the embodiment.

Further, since the fourth insulating film 12 is formed on the sidewall 13 without involving other deposition insulating films, a change in characteristics caused by, e.g., degasification or an ion component such as moisture or carbon, which occurs in the case that a thermal process is applied to the deposited insulating film, can be suppressed.

Also, although the first interlayer insulating film 14 is directly formed on the fourth insulating film 12, it is not always necessary to be directly in contact with the fourth insulating film 12. For example, gettering effect is also obtained in such a manner that the first interlayer insulating film 14 is formed as the insulating film between the wiring layers and the insulating film on the wiring layer.

When the above-described silicate glass is used as the first interlayer insulating film 14, it has bad gap-filling property immediately just after the deposition. Therefore, the silicate glass is subjected to annealing after the deposition, e.g., at a temperature between 700° C. and 1000° C. for 2 to 120 minutes, thereby obtaining a planarized surface thereof by viscous flow. In the annealing, the moisture or the hydronium ion contained in the silicate glass is liberated. However, by forming the fourth insulating film 12, it can be prevented that the gate edge of the memory cell is oxidized by the moisture and the blocking oxide film at an edge of the gate electrode 8 is thickened to change the shape.

Inorganic glass made of, e.g., cyclopenthasilane or polysilazane may be used as the first interlayer insulating film 14. In this case, the oxidation process is required in order to transform cyclopenthasilane or polysilazane into the inorganic glass, and the gate edge portion of the memory cell is oxidized by an oxidizer in the oxidation process, so that the blocking oxide film at the edge portion of the gate electrode 8 is thickened to change the shape. However, such a problem can be prevented by forming the fourth insulating film 12.

The stacked structure composed of the silicon oxide film, formed by, e.g., TEOS or HDP, and other interlayer films such as HSQ may be used as the first interlayer insulating film 14.

Meanwhile, the silicon nitride film used for the passivation film 17 blocks the moisture diffused from the outside of the chip (upper surface), but a large amount of hydrogen or hydrogen radical is generated in the formation of the silicon nitride film. Since the hydrogen is blocked by the fourth insulating film 12 having the higher stopping capacity than that of the silicon oxide film, it can be avoided that the hydrogen changes the trap density of SiN of the charge accumulation layer 5 or surface state density of the tunneling insulating film to fluctuate the charge retaining characteristics of the memory cell.

In order to prevent spread of the threshold value caused by the fluctuation of the programming or erasing electric field, it is desirable that the insulating films 4, 5, and 6 are formed in the uniform thickness on the channel region between the source/drain regions 9 in the semiconductor region 1.

In the above-described characteristics, the thickness "b" at the sidewall of the gate electrode 8 in the sidewall 13 is smaller than the thickness "a" of the second insulating film (blocking oxide film) 6 which is the top oxide film of the stacked ONO film beneath the central portion of the gate electrode 8. It has been found by the inventors that the short channel effect of the cell transistor whose gate length is particularly not more than 0.2 μm is improved by satisfying the condition of a>b.

Figure 3:
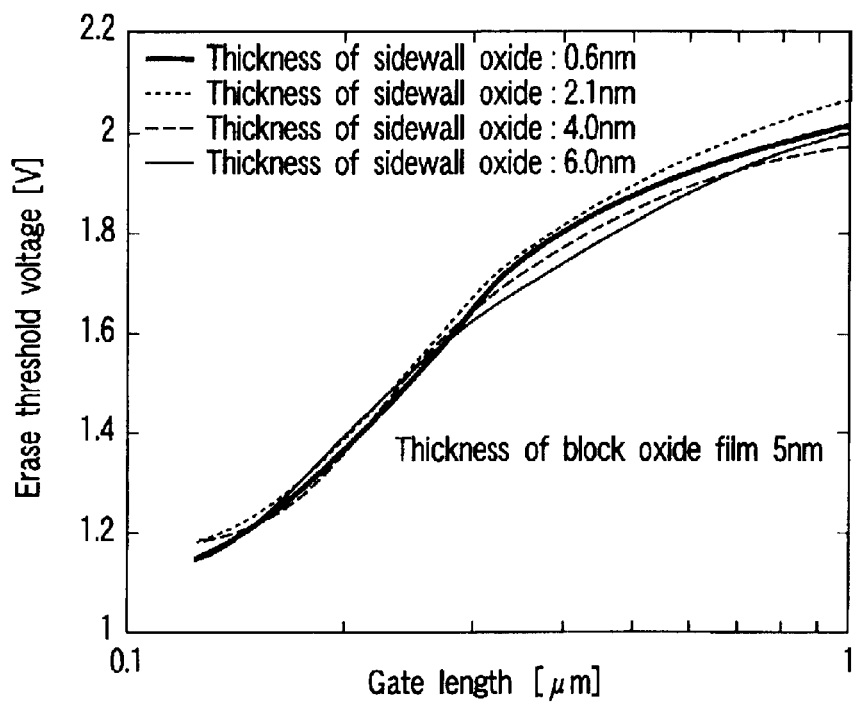
FIG. 3 is a characteristic view showing dependence of an erasing threshold value on a gate electrode length with a parameter of a sidewall thickness of the cell transistor in FIG. 1.
Figure 4:
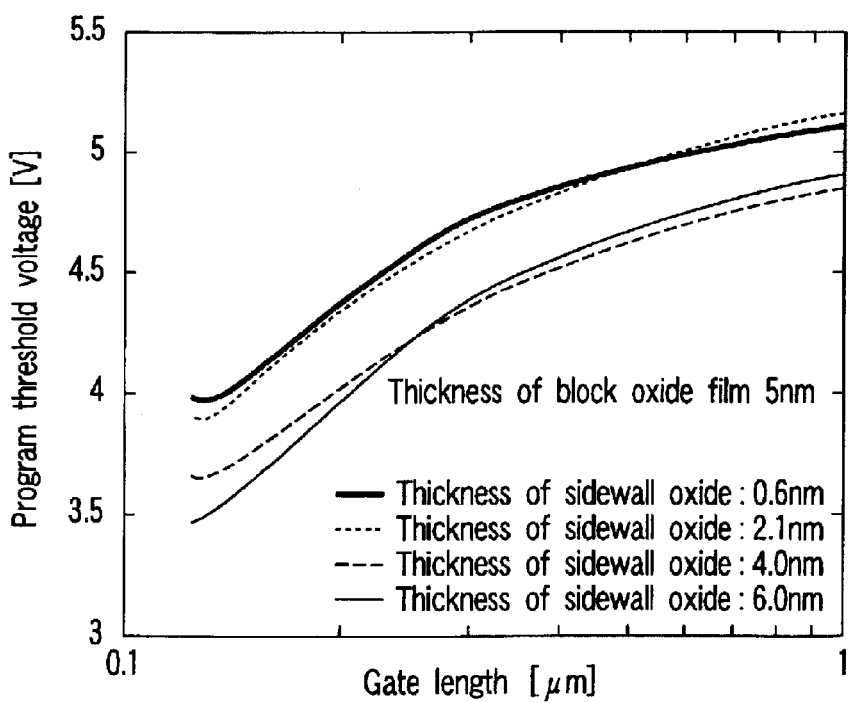
FIG. 4 is a characteristic view showing dependence of the gate electrode length on a programming threshold value with the parameter of the sidewall thickness of the cell transistor in FIG. 1.

FIGS. 3 and 4 show dependence of the gate length of the erasing threshold value and the programming threshold value with a parameter of the thickness of the sidewall 13, in the case where the blocking oxide film 6 of the cell transistor in FIG. 1 is given by 5 nm.

In each device having the characteristics shown in FIGS. 3 and 4, the film thickness of the stacked ONO film is formed by the same batch process, so that the film thickness is controlled so as to be almost equal. The source/drain regions (9 in FIG. 1) is also formed with the same condition, and the silicon oxide film having the thickness of 2.7 nm is used for the first insulating film (4 in FIG. 1).

For the programming condition, a certain pulse voltage having the voltage of 10V to 20V and a certain pulse width of 10 μs to 10 ms is applied to the gate electrode (8 in FIG. 1), and the source/drain region 9 and the substrate region (1 in FIG. 1) are set to 0V.

For the erasing condition, a certain pulse voltage having the voltage of 10V to 20V and a certain pulse width of 1 ms to 1 s is applied to the region 1, the source/drain region 9 is set to an electrically floating state, and the gate electrode 8 is set to 0V. In the programming and erasing conditions, the tunneling current is injected from the channel to the charge accumulation layer (5 in FIG. 1).

As can be seen from the characteristics shown in FIG. 3, the erasing threshold value decreases with shortening the gate length of the cell transistor, however, the characteristic that the erasing threshold value depends on the thickness of the sidewall 13 turns out within the range ±0.1V.

As can be seen from the characteristics shown in FIG. 4, the programming threshold value decreases with shortening the gate length of the cell transistor, and the amount of decrease in the programming threshold value is larger than that of the erasing threshold value. Accordingly, in the state in which the conditions of the programming voltage pulse and the erasing voltage pulse are constant, a difference between the programming threshold value and the erasing threshold value (threshold value window) decreases with the shortening gate length.

In particular, the programming threshold value increases with thinning the thickness of the sidewall 13 in the range from 6 nm to 0.6 nm, when the gate length is not more than 0.2 μm. That is, it is found that the difference between the programming and erasing threshold values (threshold value window) can be increased by thinning the film thickness of the sidewall 13.

Figure 5A:
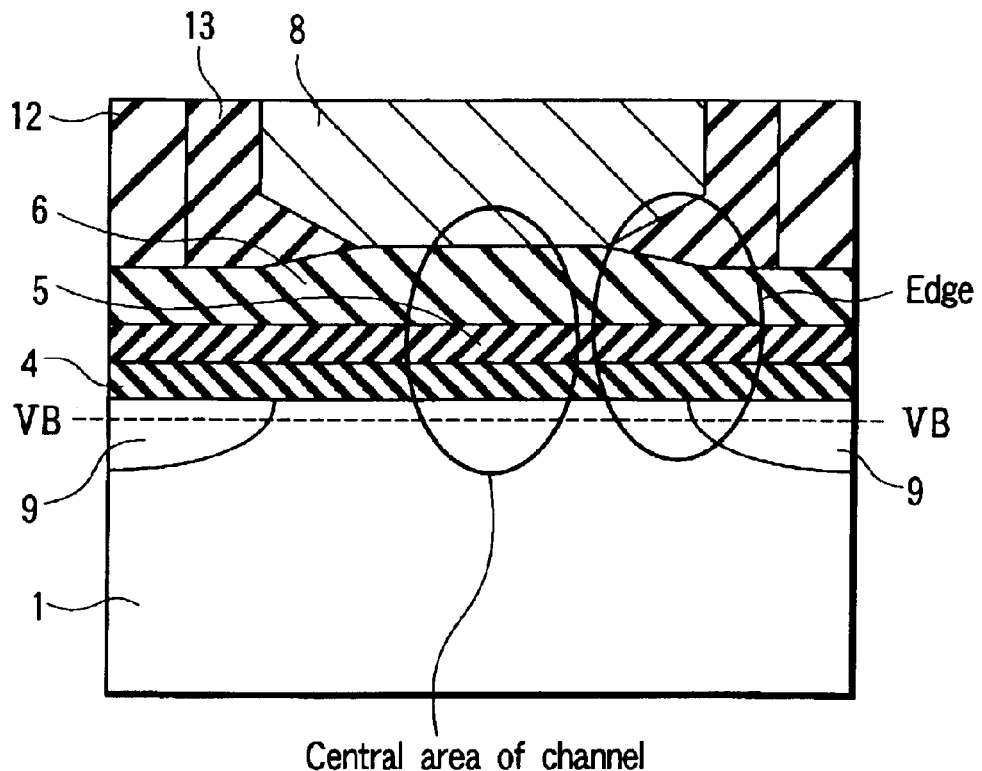
FIG. 5A is a sectional view showing a transistor model for explaining a phenomenon in which the writing threshold value is decreased with shortening the gate length of the cell transistor in FIG. 1.
Figure 5B:
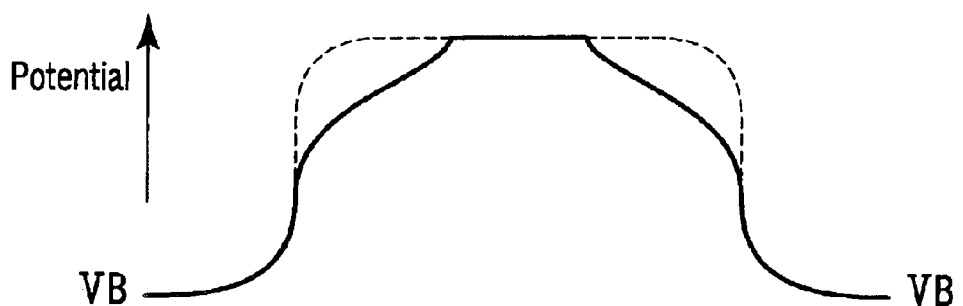
FIG. 5B is a view showing schematically a potential distribution along a VB—VB line.

FIGS. 5A and 5B show a model explaining a phenomenon in which the programming threshold value decreases with shortening the gate length of the cell transistor in FIG. 1 (a state in which the short channel effect is worsened by increasing the film thickness of the sidewall 13).

FIG. 5A is a sectional view showing the cell transistor in FIG. 1.

In FIG. 5A, the sidewall 13 intrudes between the gate electrode 8 and the blocking oxide film 6 in the form of a wedge near the source/drain region 9 because the sidewall 13 is formed by the oxidation or the nitriding of the gate electrode 8. For convenience, the region where the sidewall 13 intrudes in the form of the wedge and the blocking oxide film 6 is thickened is called a gate edge portion. In the gate edge portion, the distance from the gate electrode 8 to the semiconductor region 1 is increased to decrease the programming electric field in programming, compared with the central area of the channel.

When corners of the gate electrode 8 is rounded at the gate edge portion by the oxidation or the oxynitriding for forming the sidewall 13, the electric field is decreased at the corner portion of the gate electrode 8 to reduce the programming electric field. As a result, in the gate edge portion, the amount of charges to be programmed is decreased, compared with the central area of the channel.

FIG. 5B schematically shows a potential distribution along a VB—VB line in the semiconductor region 1 extremely near the first insulating film 4 (for example, a region which is located at a 0.2 nm inside from the interface between the insulating film 4 and the semiconductor region 1) during reading after programming.

In FIG. 5B, the solid line shows channel potential for the second conductivity type carrier (electron) and the broken line shows the case where the programming charges are uniformly injected into the central area of the channel and the gate edge portion.

The channel potential is increased as the amount of negative charges to be programmed is increased, so that the inversion becomes difficult. Consequently, in the gate edge portion, the channel potential is decreased during reading after programming. Therefore, the programming threshold value is apt to be decreased compared with the case where the charges are uniformly injected. Further, when the gate length is decreased, the potential of the gate edge portion extends to the central area of the channel, thereby further enlarging the decrease in the programming threshold value. That is, as the gate length is decreased to decrease the channel length, the decrease in the programming threshold value is further enlarged.

In FIGS. 5A and 5B, for easy understanding of the explanation, it is assumed that the voltage applied between a pair of source/drain regions 9 is sufficiently smaller than the built-in voltage between the semiconductor region 1 and the source region or drain region 9. However, a qualitative result is the same even in the case where the voltage between the pair of source/drain regions 9 is high.

In the erasing state, an absolute value of the electric field at the gate edge portion is lower than the central area of the channel, and the charge in the central area of the channel is charged more positive than that in the gate edge portion. Accordingly, the channel potential for the second conductivity type carrier is increased in the gate edge portion, and the amount of decrease in the erasing threshold value becomes smaller than that in the programming threshold value.

That is, in order to increase the threshold value window when the gate length is decreased, it is important that the difference between the amount of decrease in the erasing threshold value and that in the programming threshold value is decreased. For this purpose, it is important in the structure that the oxide film thickness of the sidewall 13 is decreased at the gate edge and the sidewall 13 is prevented from intruding between gate electrode 8 and the blocking oxide film 6 in the form of the wedge.

As described above, by forming the fourth insulating film 12, the problem that an oxide radical, generated by the viscous flow of the interlayer film 14 or transformation into the oxide film, oxidizes the gate edge portion of the blocking oxide film 6 in the memory cell can be prevented.

In order to suppress the decrease in the threshold value window, it is desirable that the source/drain regions 9 are formed to extend to the central direction of the channel more than the length in which the sidewall 13 intrudes into the space between the gate electrode 8 and the blocking oxide film 6.

The larger channel length can be secured in such a manner that the length between the source/drain regions 9 of the overlap region under the gate electrode 8 is decreased by thinning the film thickness of the sidewall 13. This allows the short channel effect to be more suppressed. Load capacitance between the source/drain region 9 and the gate electrode 8 can be decreased because the length of the overlap region is short, and the gate electrode 8 can be charged and discharged at a fast rate because mirror capacitance for the gate electrode 8 of the cell transistor can be decreased.

In the structure of the first embodiment, even if the gate electrode 8 of the cell transistor and the gate electrode 8 of the MISFET are simultaneously formed, when the silicon oxide film having the thickness of the range from 5 nm to 30 nm is simultaneously formed as the gate insulating film 2 of the MISFET, it is confirmed that good operation of the MISFET can be obtained without increasing the leakage current from the gate electrode 8, even in the case where the sidewall 13 is thinned to the range from 0.6 nm to 6 nm. This is because the wedge-shaped portion is formed between the gate electrode 8 and the gate insulating film 2 of the MISFET by the formation of the sidewall 13 having the thickness of not less than 0.6 nm, the thickness of the sidewall 13 is increased, and the electric field is released. Needless to say, this effect is also obtained in the case that the thickness of the gate insulating film 2 is decreased.

Further, about the cell transistor shown in FIG. 1, in the sidewall 13 of the range from 0.6 nm to 6 nm, none in $10^7$ bits exists in the outlier in a box plot of the programming threshold value and the erasing threshold value. It is shown that improvements of the reliability of the MISFET and the reliability of the cell transistor of the MONOS memory can be achieved simultaneously.

As described above, the inventors verify that the short channel effect of the programming threshold value is improved in the case where the film thickness "b" of the sidewall oxide film is formed smaller than the film thickness "a" of the blocking oxide film in the cell transistor of the MONOS memory. Further, the inventors verify that the short channel effect is particularly improved in the case where the gate length is not more than 0.2 µm.

(Second Embodiment)

Figure 6:
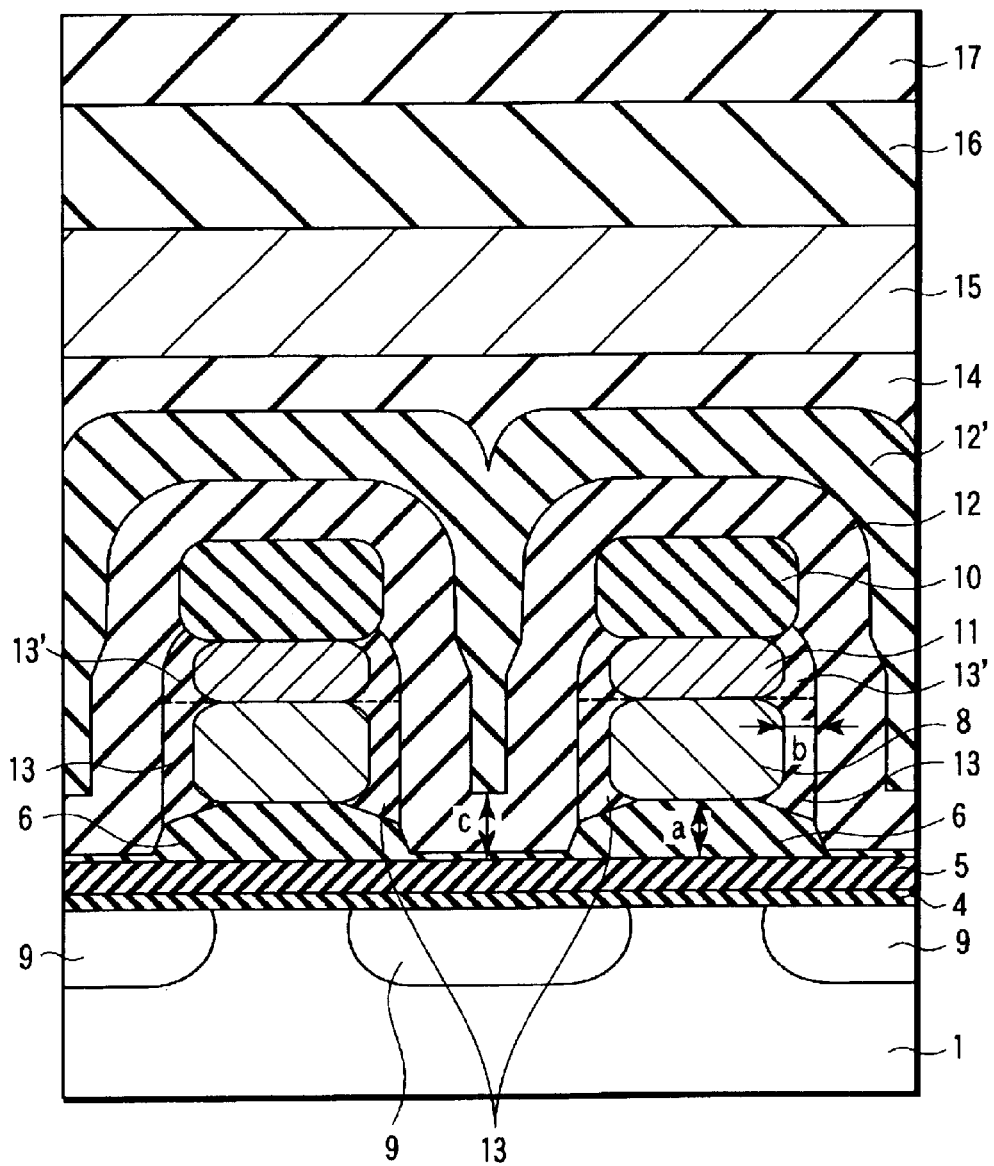
FIG. 6 is a sectional view showing the gate structure of the cell transistor of a cell region in the MONOS memory formed on the same semiconductor substrate according to a second embodiment.
Figure 7:
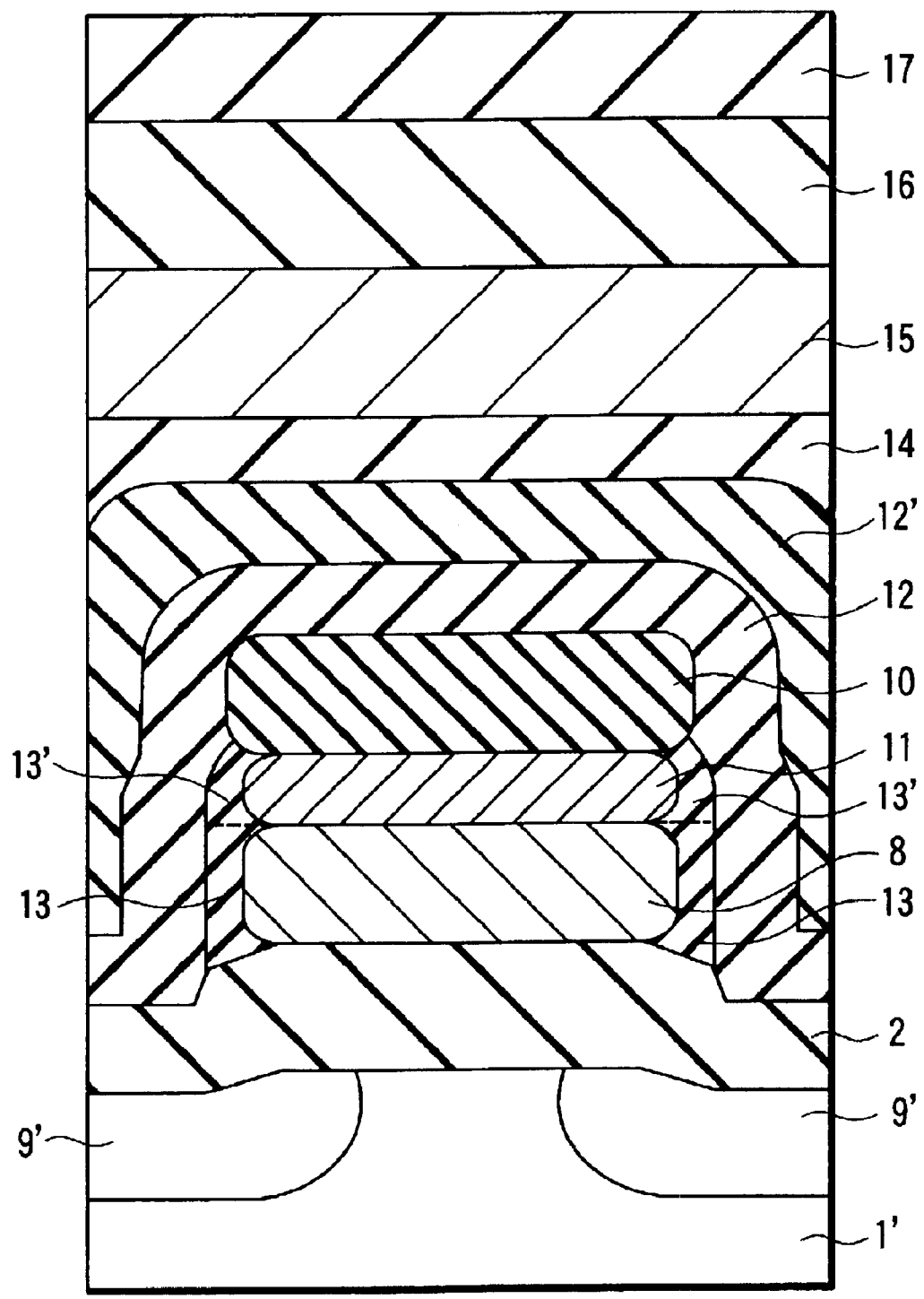
FIG. 7 is a sectional view showing the gate structure of the MISFET for a peripheral circuit, which is formed on the same semiconductor substrate as the cell transistor shown in FIG. 6 and in which the gate electrodes of the MISFET and the cell transistor are processed in common.

FIGS. 6 and 7 show a sectional structure corresponding to the MISFET of the cell transistor and the peripheral circuit of the cell region in the MONOS memory formed on the same semiconductor substrate according to a second embodiment.

In the structure shown in FIGS. 6 and 7, compared with the structure shown in FIGS. 1 and 2, a configuration of films which is formed above the gate sidewalls 13 and 13' is different and other portions are the same. Therefore, the detailed description is omitted, indicating the same reference numerals and signs as those in FIGS. 1 and 2.

That is, in the structure shown in FIGS. 6 and 7, a fifth insulating film 12' is formed above the gate sidewalls 13 and 13' through the fourth insulating film 12.

The fourth insulating film 12 is the deposited insulating film which is formed by, e.g., the HDP, the CVD method, the sputtering method, or a coating method, and the fourth insulating film 12 is formed in the thickness range from 5 nm to 200 nm. The fourth insulating film 12 releases a stress generated by the fifth insulating film 12' which is formed after the fourth insulating film 12, and acts as a buffer oxide film suppressing a crystal defect.

In the second embodiment, compared with the conventional example, the thickness "b" in the sidewall 13 is made smaller than the thickness "a" of the blocking oxide film 6 under the central portion of the gate electrode 8. Therefore, it is suppressed that the sidewall 13 intrudes between the gate electrode 8 and the blocking oxide film 6 in the form of the wedge.

Because the advantages in the second embodiment are basically similar to those of the first embodiment, though the description of the same advantages are omitted, the second embodiment has unique advantages described below.

Since the silicon oxide film of the fourth insulating film 12 has a lower dielectric constant than that of the fifth insulating film 12', which is provided after the fourth insulating film 12. Therefore, the overlapped capacitance between the source/drain regions 9 and the gate electrode 8 can be decreased to reduce charge and discharge time of the gate, compared with the first embodiment.

Further, since the fourth insulating film 12 having the lower dielectric constant than that of the first embodiment can be used for the insulation between the two gate electrodes 8 adjacent to each other, the capacitance between the gate electrodes 8 can be decreased. Therefore, the programming electric field is not almost affected by the potential of the adjacent two gate electrodes 8, thereby further reducing the charge and discharge time of the gate.

It is not always necessary to form the fifth insulating film 12' on the third insulating film 10. The fifth insulating film 12' may be selectively formed in the gate sidewall direction.

In the embodiment, the ion implantation forming the source/drain regions 9 may be performed after the formation of the fourth insulating film 12. This enables the overlap length between the gate electrode 8 and the source/drain regions 9 to be shortened by the thickness of the insulating film 12.

Therefore, the effective channel length can be increased more than the first embodiment, thereby further suppressing the short channel effect. Moreover, compared with the first embodiment, since the ion-implanted region for forming the source/drain regions 9 can be spaced apart from the edge of the gate electrode 8, the generation of the crystal defect can be lessened to provide the source/drain regions 9 with the reduced leakage current.

The fifth insulating film 12' made of, e.g., the silicon nitride film, the silicon oxynitride film, or the alumina film is formed on the fourth insulating film 12, for example, in the thickness range from 5 nm to 200 nm. In order to prevent the gas, the radical, or the ion from films formed above the fifth insulating film 12' from adversely affecting the memory cell, as shown in FIG. 6, it is desirable that the fifth insulating film 12' is deposited over the cell transistor and that at least the side surface of the gate electrode 8 between adjacent two memory cells and the source/drain regions 9 are covered therewith.

As shown in FIG. 6, the distance "c" between the fifth insulating film 12' and the charge accumulation layer 5 is set to be larger than the thickness "a" of the blocking oxide film 6 under the central portion of the gate electrode 8, thereby increasing the potential of the interface between the fourth insulating film 12 and the fifth insulating film 12' higher than the potential of the interface between the gate electrode 8 and the blocking oxide film 6, which causes the charge to hardly leak from the semiconductor substrate 1 or the charge accumulation layer 5 to the interface between the insulating film 12' and the insulating film 12.

By using the structure described above, it is difficult that the charge is accumulated at the interface between the fourth insulating film 12 and the fifth insulating film 12'. Consequently, the fluctuation in the threshold value caused by cumulative accumulation of the charge, which is difficult to control, can be avoided.

In the second embodiment, even if the gate electrode of the cell transistor and the gate electrode of the MISFET are simultaneously processed by using the deposited silicon oxide film having the film thickness of the range from 5 nm to 30 nm as the fourth insulating film 12, when the silicon oxide film having the thickness of the range from 5 nm to 30 nm is simultaneously formed as the fourth insulating film 12, the good operation of the MISFET can be obtained without increasing the leak current from the gate electrode 8, even in the case where the sidewall 13 is thinned to the range from 0.6 nm to 6 nm. This is because the wedge-shaped sidewall 13 is formed between the gate electrode 8 and the gate insulating film 2 of the MISFET by the formation of the sidewall 13 having the thickness of not less than 0.6 nm and the electric field is released by increasing the film thickness of the sidewall 13. This advantage is also obtained in the case where the film thickness of the gate insulating film 2 is decreased.

Further, about the cell transistor shown in FIG. 6, in the same way as the cell transistor described above referring to FIG. 1, even 1 bit in $10^7$ bits is not present in the outlier in a box plot of the programming threshold value and the erasing threshold value. It represents that improvements of the reliability of the MISFET and the reliability of the cell transistor of the MONOS memory can be achieved simultaneously.

In the first and second embodiments, a forming direction of a data control line (which corresponds to both sides direction of the paper in FIGS. 1 and 6) connected to a plurality of gate electrodes 8 is intersected at right angle with the forming direction of the channel (which corresponds to a lateral direction of the paper in FIGS. 1 and 6). The first and second embodiments have the shape such that a plurality of memory cells share one source/drain region 9. Such shape can be applicable to the structure, e.g., an array of a NAND type memory cell in which the source and drain regions in the adjacent memory cells are connected in series. Further, when the shared source/drain region 9 is formed as the common source line and extended to the both sides direction of the paper in FIGS. 1 and 6, the shape can be applicable to the array of a NOR type memory cell in which the drain regions of the memory cells are connected in parallel. Because these array configurations and advantages are disclosed in, e.g., Japanese Patent Application 2001-264754, which is a prior application by the inventors, the description is omitted here.

(Third Embodiment)

Figure 8:
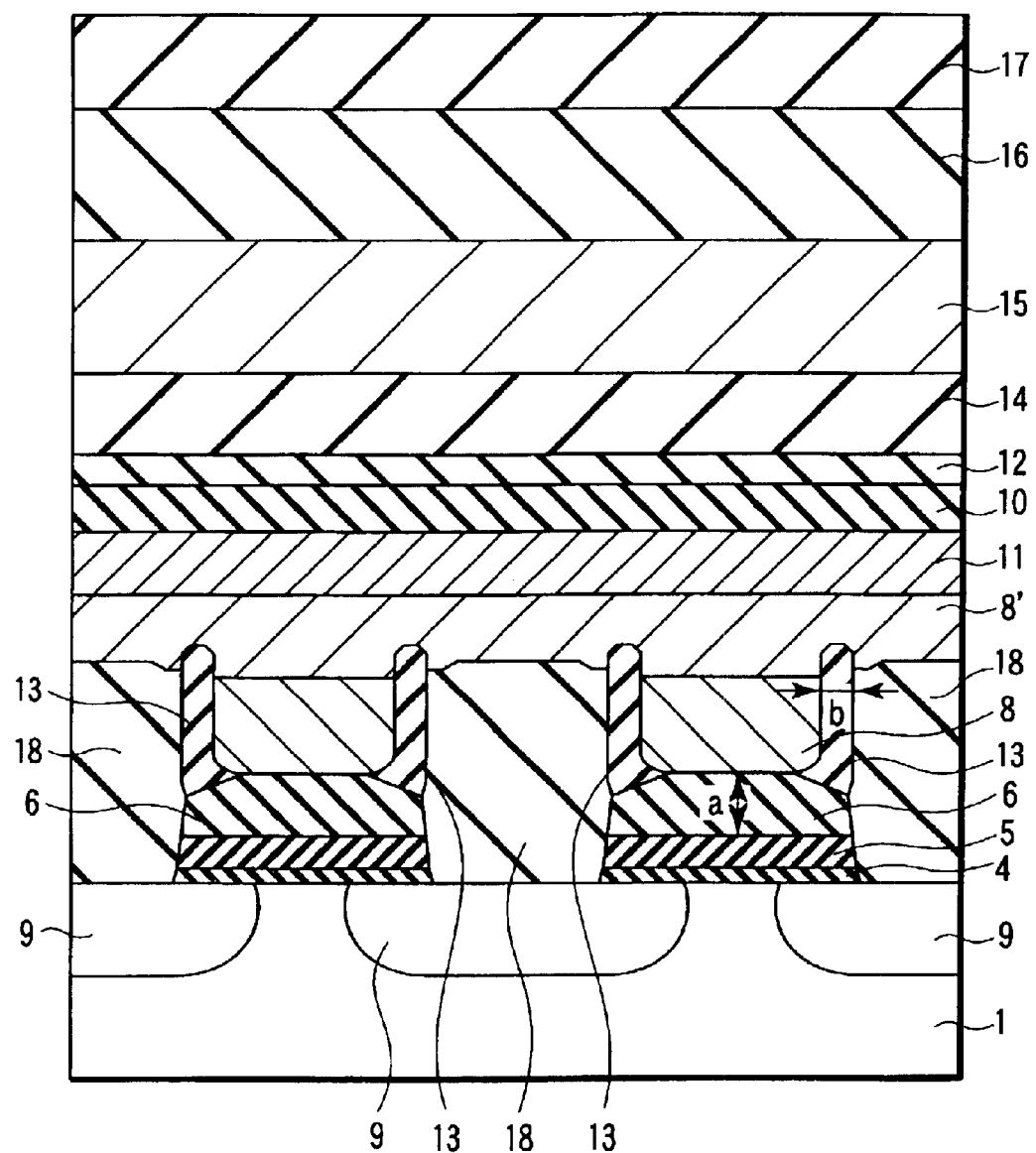
FIG. 8 is a sectional view showing a structure of a state in which each gate electrode of two cell transistors adjacent to each other is connected by a data control line in the cell region of the MONOS memory according to a third embodiment.
Figure 9:
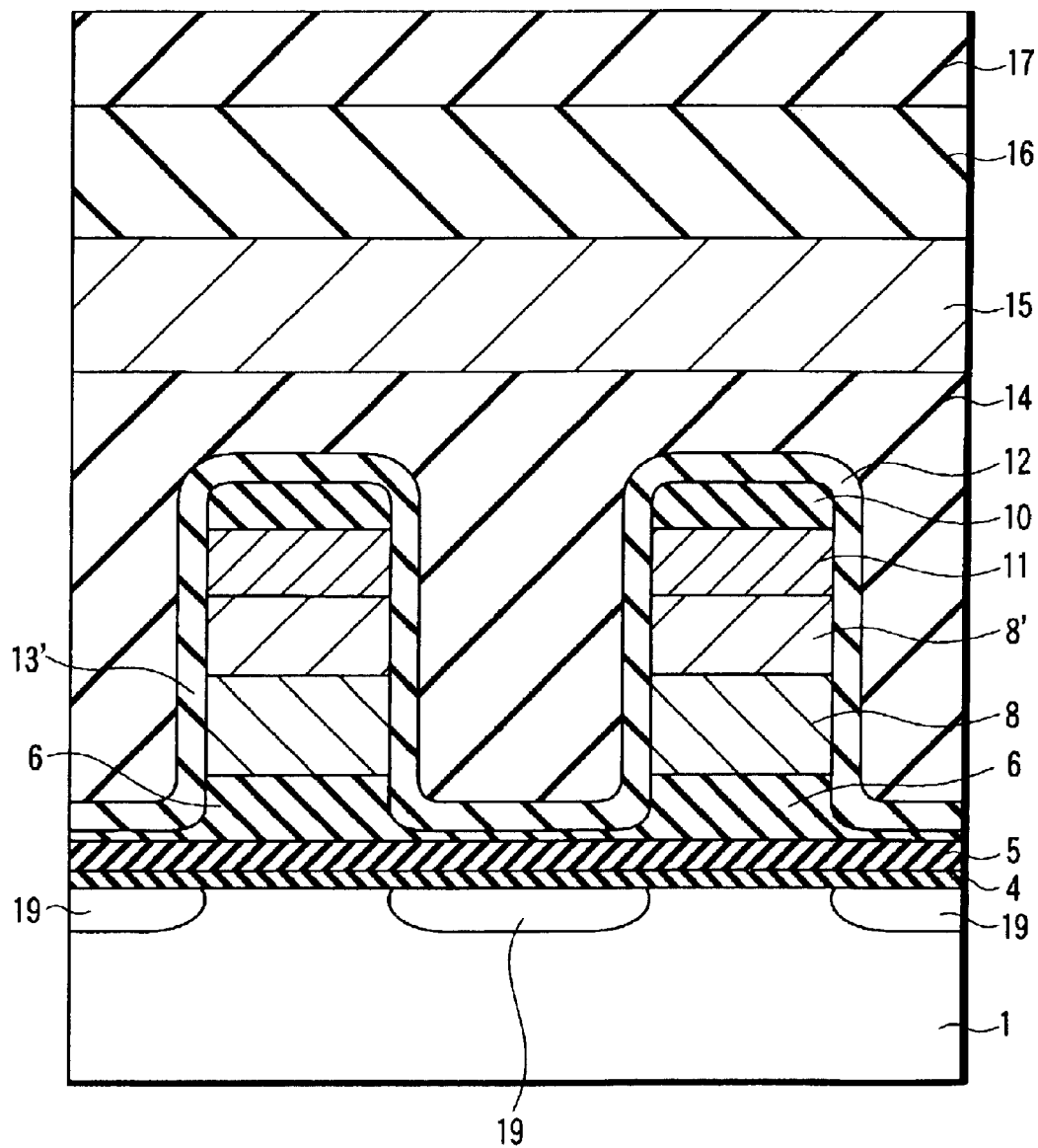
FIG. 9 is a sectional view showing a structure in which a pattern passes through the gate electrode in a direction crossed at right angle with the pattern in FIG. 8.
Figure 10A:
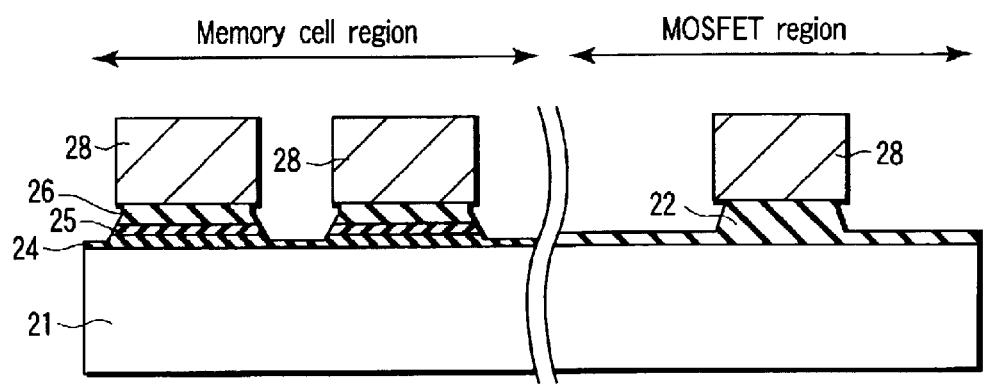
FIGS. 10A and 10B are a sectional view showing one example of the gate structure of the cell transistor in a memory cell region and the MISFET in a peripheral circuit region in a manufacturing process of a conventional MONOS memory.
Figure 10B:
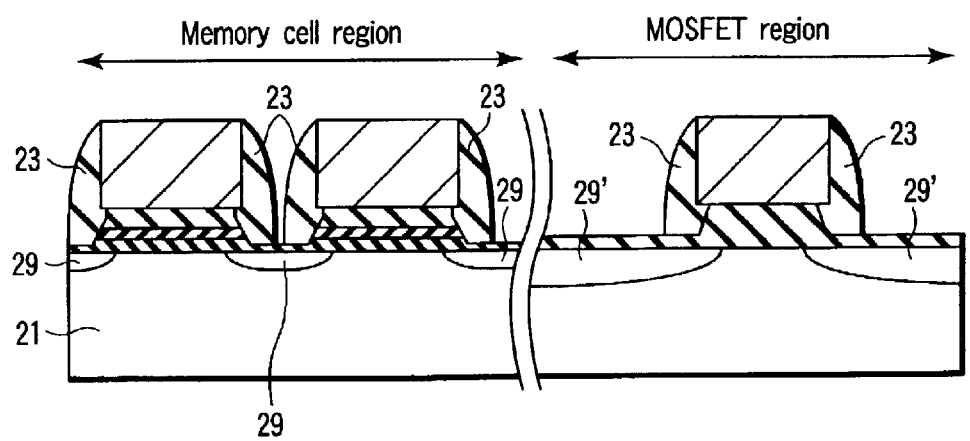

FIG. 8 shows a sectional structure of the state in which each gate electrode 8 of two cell transistors adjacent to each other is connected with the data control line (corresponds to 11 or 8') in the cell region according to a third embodiment. FIG. 9 shows a sectional structure in an intersecting direction at right angles with the pattern in FIG. 8, which passes through the gate electrode 8.

In the structure shown in FIGS. 8 and 9, compared with the structure shown in FIG. 6, the following point is different and other portions are the same, so that the detailed description is omitted, indicating the same reference numerals as those in FIG. 6.

That is, (1) Part of the charge accumulation layer 5 is removed on the source/drain regions 9, and an isolation insulating film 18 made of, e.g., the silicon oxide film is formed between the gate electrodes 8 of the adjacent memory cells.

(2) A gate wiring layer 8' made of, e.g., polysilicon or SiGe mixed crystal is deposited in the range of 10 nm to 300 nm on the gate electrode 8, and the metal backing layer 11 and the mask insulating film 10 are formed in order on the gate wiring layer 8'. In this case, the forming direction of the data control line (corresponds to 11 or 8') connected to the gate electrode 8 coincides with the forming direction of the channel.

(3) The fourth insulating film 12 is provided to cover the multilayer structure of the second insulating film 6, the gate electrode 8, the gate wiring layer 8', the metal backing layer 11, and the mask insulating film 10. Similarly to the second embodiment, it is desirable that the fourth insulating film 12 is deposited over the cell transistor in order to prevent the gas, the radical, or the ion from the films formed thereabove from adversely affecting the memory cells.

The MISFET is formed on the same semiconductor substrate as the cell transistor of the cell region in the MONOS memory, and each of the gate electrodes is simultaneously processed. Therefore, the improvement of the reliability is obtained, as described in the first and second embodiments.

As described in the first and second embodiments, after the gate electrode 8 is processed, the sidewall 13 is formed by the oxidation or the oxynitriding, and the source/drain region for the MISFET is formed. Accordingly, for example, phosphorus, arsenic, or antimony may be formed in the range from 10 nm to 500 nm by the diffusion or the ion-implantation so that surface concentration is $10^{17}$ cm$^{-3}$ to $10^{21}$ cm$^{-3}$.

For example, the gate structure shown in FIGS. 8 and 9 can be formed by the following procedure. After the first insulating film 4, the charge accumulation layer 5, the second insulating film 6, and the gate electrode 8 are formed in order on the silicon substrate, these are patterned to remove selectively unnecessary portions thereof. After the sidewall 13 is formed by the oxidation or the oxynitriding of the gate electrode 8, the n-type impurity is implanted into the substrate 1 so as to have the surface concentration of $10^{17}$ cm$^{-3}$ to $10^{21}$ cm$^{-3}$ and the depth of 10 nm to 500 nm, thereby providing the n-type layers for the source/drain regions 9.

After the silicon oxide film for the isolation, the silicate glass, or the inorganic glass is deposited over the substrate surface to the thickness of 10 nm to 1000 nm, it is planarized by, e.g., CMP (Chemical Mechanical Polishing) to provide the isolation film 18. Further, the upper surface of the gate electrode 8 is exposed by, e.g., wet etching of ammonium fluoride solution.

Thereafter, the wiring material for forming the gate wiring layer 8' of, e.g., polysilicon or the SiGe mixed crystal are deposited in the range from 10 nm to 300 nm, and then the metal backing layer 11 and the mask insulating film 10 are deposited over the substrate surface. In order to prevent the erasing time or the programming time from increasing, the concentration of boron, phosphorus, or arsenic in the gate wiring material is given by more than $1 \times 10^{19}$ cm$^{-3}$, thereby reducing the electric field applied to the stacked ONO film by depletion of the gate wiring material.

The patterning of the cell transistor portion is performed in the direction intersecting at right angles with the pattern in FIG. 8, thereby etching the mask insulating film 10, the metal backing layer 11, the gate wiring material, the gate electrode material, and the second insulating film 6.

Thereafter, as shown in FIG. 9, a p-type stopper region 19 is formed in the semiconductor region 1 in order to decrease the leakage current between the channels of the two adjacent cell transistors. The p-type stopper region 19 is formed by the ion implantation of, e.g., boron, $BF_2$, or indium so as to obtain the surface concentration of $10^{16}$ cm$^{-3}$ to $10^{18}$ cm$^{-3}$ and the depth of 10 nm to 500 nm. Further, the fourth insulating film 12 made of the silicon nitride film, the silicon oxynitride film, or the alumina film is formed in the thickness range, e.g., from 5 nm to 200 nm.

There are the following advantages in the third embodiment.

(1) The control electrode (gate electrode 8 and gate wiring layer 8') is formed in the direction (lateral direction of the paper in FIG. 8) intersecting at right angles with the direction in which the source/drain region 9 is formed (both sides direction of the paper in FIG. 8). Accordingly, it is preferable to realize the structure in which the source regions and the drain regions of the adjacent cell transistors are connected in parallel, e.g., the AND type cell array or a Virtual Ground Array. Also, since the isolation film 12, the source/drain regions 9, and the charge accumulation layer 5 can be formed with self-aligning, it is not necessary to secure the margin of the registration error thereamong and the cell array having the higher density can be realized. These array configurations and advantages are disclosed in, e.g., Japanese Patent Application 2001-264754, which is a prior application by the inventors, so that the description is omitted here.

(2) Since part of the charge accumulation layer 5 is removed on the source/drain regions 9, the charge accumulation is hardly generated on the removed region. Accordingly, when the charge accumulation layer 5 is formed, the change in the amount of charge accumulation, which occurs, e.g., in the process or in changing the voltage of the source/drain region, can be prevented, and resistance of the source/drain region can be kept constant.

In each of the above-described embodiments, although the programming and the erasing are carried out by providing the tunneling current from the semiconductor substrate 1 to the charge accumulation layer 5 through the insulating film 4 at the entire surface of the channel, the advantages as described above is obtained, even in the case where an erasing method using a hot hole, so-called hot hole (assisted tunneling) erase is adopted. In order to perform the hot hole (assisted tunneling) erase, the positive voltage between 2V and 10V is applied between the drain region and the semiconductor substrate 1, while the negative voltage between −1V and −10V is applied between the gate electrode 8 and the semiconductor substrate 1. Then, electron/hole pairs, which become Gate Induced Drain Leakage (GIDL), is generated between the drain and the substrate, and the erasing is accomplished by injecting the holes into the charge accumulation layer 5. In this case, since the thickness "b" of the sidewall 13 is formed thinner than the thickness "a" of the blocking oxide film 6 under the central portion of the gate electrode to prevent that the sidewall 13 intrudes between the gate electrode 8 and the blocking oxide film 6 in the form of the wedge, the structure has the advantage for increasing the erasing speed. This is because the GIDL is generated in the overlapped region between the gate electrode 8 and the drain region 9, the electric field applied to the insulating film 4 at the gate edge portion is increased by decreasing the thickness that the sidewall 13 intrudes between the gate electrode 8 and the blocking oxide film 6 in the form of the wedge, band bending is increased at a portion where the drain region 9 is in contact with the insulating film 4, and the large hole current is obtained.

As disclosed in "Flash Memory Technology Handbook", which is a non-patent document, published by Science Forum (Aug. 15, 1993), P206–215, it is also clear that, when the film thickness of the gate oxide film on the drain is decreased, even if the voltage between the gate electrode 8 and the drain region 9 is retained equally, the current is increased.

From the above-described explanation, when the hole current between the drain region 9 and the semiconductor substrate 1 is increased, the hole current injected into the charge accumulation layer 5 can be also increased to reduce the erasing time. Certainly, in the case where such erasing method is used, when the gate electrodes of the MONOS memory and the MISFET are processed simultaneously in the first and second embodiments, and when the silicon oxide film having the film thickness of the range from 5 nm to 30 nm is formed simultaneously as the gate insulating film 2, the good operation of the transistor can be obtained without increasing the leakage current from the gate electrode 8 even if the film thickness of the sidewall is decreased in the range from 0.6 nm to 6 nm. This is because the wedge-shaped sidewall 13 is formed between the gate electrode 8 and the gate insulating film 2 of the MISFET by the formation of the sidewall having the thickness of more than 0.6 nm and the electric field is alleviated by increasing the film thickness of the gate insulating film 12. This advantage is also obtained in the case where the film thickness of the gate insulating film 2 is decreased.

In order to generate efficiently the hole current by the GIDL, as disclosed in the above-described non-patent document, it is desirable that the concentration of the second conductivity type carrier is set to the range from $1 \times 10^{18}$ cm$^{-3}$ to $1 \times 10^{20}$ cm$^{-3}$ in the drain region formed under the gate electrode.

In each of the above-described embodiment, except for converting silicon into the silicon oxide film or the silicon nitride film, there may be used such methods that, e.g., the oxygen ion is implanted into the deposited silicon, or that the deposited silicon is oxidized for producing the insulating film such as the isolation film or the interlayer insulating film.

Titanium oxide (TiO$_2$), alumina (Al$_2$O$_3$), a tantalum oxide film, strontium titanate, barium titanate, or zirconium lead titanate or the stacked film of those materials may be used as the charge accumulation layer 5.

In each of the above-described embodiments, although the p-type silicon substrate is used as the semiconductor region or the substrate 1 or 1', the single crystal semiconductor substrate including silicon such as an SOI silicon layer of an n-type silicon substrate or an SOI substrate, the SiGe mixed crystal, or an SiGeC mixed crystal may be used.

Although the example for producing the n-type MONOS-FET on the p-type semiconductor layer 1 has been described, it may be replaced so that the p-type MONOS-FET is formed on the n-type semiconductor layer 1.

The Si semiconductor, SiGe mixed crystal, and SiGeC mixed crystal can be used as the gate electrode 8 and the gate lead 8', the polycrystalline may be also used, and the multilayer structure of those materials may be used. Amorphous Si, amorphous SiGe mixed crystal, or amorphous SiGeC mixed crystal can be used, and the multilayer structure of those materials may be used. However, it is desirable that the gate electrode 8 and the gate lead 8' are composed of the semiconductor materials, particularly the semiconductor material including Si, because the sidewall 13 having the good characteristics can be formed by the oxidation or the oxynitriding of the gate electrode 8.

Further, the charge accumulation layer 5 may be separated between the source and the drain or the charge accumulation layer 5 may be formed in the shape of a dot.

In each of the above-described embodiment, although the section of the metal backing layer 11 formed on the gate electrode 8 or the gate lead 8' by the deposition method has been shown, for example, the metal backing layer 11 may be formed in such a manner that metal such as Ti, Co, Ni, Mo, Pd, or Pt reacts with the gate electrode 8 or the gate lead 8' to form silicide. Also, various modifications can be implemented without departing from scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a semiconductor region having a first conductivity type;
    source and drain regions of an electrically programmable and erasable memory cell transistor, provided in the semiconductor region, having a second conductivity type;
    a gate insulating film structure provided on the semiconductor region between the source and drain regions, the gate insulating film structure being comprised of a first insulating film, a charge accumulation layer and a second insulating film, the charge accumulation layer being composed of one material selected from a silicon nitride film, a silicon oxynitride film, an alumina film and a stacked film of these films;
    a control gate electrode provided on the second insulating film;
    a gate sidewall provided on a side of the control gate electrode, the thickness thereof being thinner than that of the second insulating film in the central area of the control gate electrode;

a third insulating film provided above the control gate electrode; and a fourth insulating film provided to cover the gate electrode sidewall and the third insulating film therewith, wherein the thickness of the gate sidewall is in the range from 0.6 nm to 6 nm.

2. The semiconductor memory device according to claim 1, wherein a distance between the fourth insulating film and the charge accumulation layer is smaller than the thickness of the second insulating film under the center of the gate electrode in a section of the gate sidewall.

3. The semiconductor memory device according to claim 1, wherein the first insulating film is comprised of one material selected from a silicon oxide film and the silicon oxynitride film whose oxygen composition is larger than that of the charge accumulation layer.

4. The semiconductor memory device according to claim 1, wherein the second insulating film is comprised of one material selected from the silicon oxide film, the silicon oxynitride film whose oxygen composition is larger than that of the charge accumulation layer, an alumina film, a ZrSiO film, an HfSiO film, an HfSiON film, a ZrSiON film and the stacked film of these films.

5. The semiconductor memory device according to claim 1, wherein the gate sidewall is comprised of one material selected from the silicon oxide film and the silicon oxynitride film, and the oxygen composition of the gate sidewall is larger than that of the charge accumulation layer.

6. The semiconductor memory device according to claim 5, wherein the third insulating film is comprised of one material selected from the silicon oxide film and the silicon oxynitride film whose oxygen composition is larger than that of the charge accumulation layer, and the fourth insulating film is comprised of one material selected from the silicon oxynitride film whose nitrogen composition is larger than that of the third insulating film, the silicon nitride film and the alumina film.

7. The semiconductor memory device according to claim 6, wherein the distance between the fourth insulating film and the charge accumulation layer is smaller than the thickness of the second insulating film under the center of the gate electrode in the section of the gate sidewall.

8. The semiconductor memory device according to claim 6, wherein one material selected from the silicon nitride film deposited by the plasma CVD, the silicate glass containing one of boron and phosphorus with more than $1\times10^{20}$ cm$^{-3}$ and the inorganic glass composed of one of cyclopentasilane and polysilazane is provided above the fourth insulating film.

9. The semiconductor memory device according to claim 6, wherein the fourth insulating film is continuously formed between gate electrodes of adjacent memory cells.

10. The semiconductor memory device according to claim 1, wherein the third insulating film is comprised of one material selected from the silicon oxide film and the silicon oxynitride film whose oxygen composition is larger than that of the charge accumulation layer, and the fourth insulating film is comprised of one material selected from the silicon oxynitride film whose nitrogen composition is larger than that of the third insulating film, the silicon nitride film, and the alumina film.

11. The semiconductor memory device according to claim 1, wherein one material selected from the silicon nitride film deposited by plasma CVD, silicate glass containing one of boron and phosphorus of more than $1\times10^{20}$ cm$^{-3}$, and inorganic glass composed of one of cyclopentasilane and polysilazane is provided above the fourth insulating film.

12. The semiconductor memory device according to claim 1, wherein a gate length is not more than 0.2 μm.

13. The semiconductor memory device according to claim 1, wherein the fourth insulating film is continuously formed between gate electrodes of adjacent memory cells.

14. A semiconductor memory device comprising:

a semiconductor region having a first conductivity type;

source and drain regions of an electrically programmable and erasable memory cell transistor, provided in the semiconductor region, having a second conductivity type;

a gate insulating film structure provided above at least a channel region between the source and drain regions in the semiconductor region, the gate insulating film structure being comprised of a first insulating film, a charge accumulation layer and a second insulating film, the charge accumulation layer being comprised of one material selected from a silicon nitride film, a silicon oxynitride film, an alumina film and a stacked film of these films;

a control gate electrode provided on the second insulating film;

a gate sidewall provided on a side of the control gate electrode, the thickness thereof being thinner than the thickness of the second insulating film in the central area of the control gate electrode;

a third insulating film provided above the control gate electrode;

a fourth insulating film provided to continuously cover a region between each control gate electrode of adjacent cell transistors;

a fifth insulating film covering the fourth insulating film therewith, wherein a distance between the fifth insulating film and the charge accumulation layer is larger than the thickness of the second insulating film in the center of the control gate electrode, and wherein the fourth insulating film is comprised of a silicon oxide film and the fifth insulating film is comprised of one material selected from a silicon oxynitride film, a silicon nitride film, and an alumina film.

15. The semiconductor memory device according to claim 14, wherein the first insulating film is comprised of one material selected from the silicon oxide film and the silicon oxynitride film whose oxygen composition is larger than that of the charge accumulation layer.

16. The semiconductor memory device according to claim 14, wherein the second insulating film is comprised of one material selected from the silicon oxide film, the silicon oxynitride film whose oxygen composition is larger than that of the charge accumulation layer, the alumina film, the ZrSiO film, the HfSiO film, the HfSiON film, the ZrSiON film, and the stacked film of these films.

17. The semiconductor memory device according to claim 14, wherein the gate sidewall is comprised of one material selected from the silicon oxide film and the silicon oxynitride film and the oxygen composition of the gate sidewall is larger than that of the charge accumulation layer.

18. The semiconductor memory device according to claim 14, wherein one material selected from the silicon nitride film deposited by the plasma CVD, silicate glass containing one of boron and phosphorus with more than $1 \times 10^{20}$ cm$^{-3}$, and inorganic glass composed of one of cyclopentasilane and polysilazane is provided above the fifth insulating film.

19. The semiconductor memory device according to claim 14, wherein the thickness of the gate sidewall is in the range from 0.6 nm to 6 nm.

20. The semiconductor memory device according to claim 14, wherein the a gate length is not more than 0.2 $\mu$m.

21. The semiconductor memory device according to claims 14, wherein the second insulating film, the first insulating film and the charge accumulation layer, which are located between gate electrodes of adjacent memory cells, are removed to be buried with an isolation insulating film.

* * * * *